United States Patent [19]
Tousignant

[11] Patent Number: 5,000,256
[45] Date of Patent: Mar. 19, 1991

[54] HEAT TRANSFER BAG WITH THERMAL VIA

[75] Inventor: Lew A. Tousignant, St. Paul, Minn.

[73] Assignee: Minnesota Mining and Manufacturing Company, St. Paul, Minn.

[21] Appl. No.: 556,949

[22] Filed: Jul. 20, 1990

[51] Int. Cl.$^5$ ................... H01L 23/473; F28D 15/00
[52] U.S. Cl. .................... 165/46; 165/104.19; 165/104.33; 165/80.4; 361/385; 174/15.1
[58] Field of Search ............ 165/104.19, 104.33, 165/46; 361/385, 386; 174/15.1, 15.2

[56] References Cited

U.S. PATENT DOCUMENTS 2,780,757  2/1957  Thornhill et al. ............... 165/80.4
3,826,957  7/1974  McLaughlin et al. ............ 165/80.4

FOREIGN PATENT DOCUMENTS 44673  3/1980  Japan ........................ 165/46 H

OTHER PUBLICATIONS

IBM Technical Bulletin, *Thermal Enhancement of Modules*, vol. 19, No. 8, 1/1977.
IBM Technical Bulletin, *Convection Cooling in Small Terminals*, vol. 24, No. 2, 7/1981.

*Primary Examiner*—Albert W. Davis, Jr.
*Attorney, Agent, or Firm*—Donald M. Sell; Walter N. Kirn; James D. Christoff

[57] ABSTRACT

A heat transfer bag especially useful for cooling electronic components is made of a flexible sheet of material and is filled with a fluorochemical heat transfer liquid. A metallic thermal via extends through a hole in the bag for direct contact with an external surface of a heat-generating component. A portion of the via extends into the bag and functions as a heat radiating fin to enhance the transfer of heat from the component to the liquid within the bag.

11 Claims, 1 Drawing Sheet

HEAT TRANSFER BAG WITH THERMAL VIA

BACKGROUND OF THE INVENTION

1. Field of the Invention

This invention relates to a heat transfer bag useful for the dissipation of heat from electronic components such as integrated circuits, wherein the bag includes a thermal via for enhancing transfer of heat from the component to heat transfer liquid within the bag.

2. Description of the Related Art

Thermal management of electronic systems has conventionally been accomplished by the use of fans, metal heat sinks, or both. Fans, for instance, provide forcedair convection cooling, and heat sinks dissipate thermal energy from components by conduction. However, it is sometimes difficult to provide sufficient cooling for components within compact or densely arranged electronic systems. Moreover, fans often produce an unacceptable level of noise.

A recent development that has been found to efficiently transfer heat in compact electronic systems is the thermal transfer bag, also known as the Liquid Heat Sink bag available from Minnesota Mining and Manufacturing Company, assignee of the present invention. The bag is made of a sheet of flexible, durable, air-impermeable material and is filled with a thermally conductive, chemically inert, essentially gas free body of liquid which comprises fluorochemical liquid. The bag is placed between the heat-generating component and a heatdissipating surface, and conduction through the liquid as well as some movement of liquid within the bag due to convection currents transfer heat from the component to the heat-dissipating surface.

The aforementioned thermal transfer bag is advantageous in that the flexible material geometrically conforms to the configuration of the cavity within the electronic equipment, and comes into intimate contact with heat-generating components and the heat-dissipating surface to establish a thermal path therebetween. In some applications, the inherent shock-absorbing nature of the filled bag functions as a packing or cushion to protect the component from physical shock damage. The bag can easily be removed and replaced in the field during repair, and may optionally be provided with an adhesive to hold the bag in place.

There is a continuing desire, however, to increase the rate of transfer of heat away from heat-generating components in electrical devices, particularly in instances where the components produce relatively large amounts of heat or where there is a need to reduce the overall size of the device. By increasing the rate of heat transfer, heat-generating components may be spaced closer together with other components while still enabling each component to properly function within a desired temperature range of operation.

SUMMARY OF THE INVENTION

The present invention relates to heat transfer apparatus which is adapted for placement between a surface of a component to be cooled and a surface of a heat-dissipating body. The apparatus comprises a flexible, sealed bag made of a sheet of material impermeable to air and having an internal compartment, and the sheet has a hole. The apparatus also includes a quantity of heat transfer liquid that substantially fills the compartment. A thermal via extends through the hole in the sheet and has a high thermal conductivity. The via has a first portion which extends externally of the bag for thermal contact with a surface of a heat-generating component, and a second portion which extends internally in the compartment for contact with the heat transfer liquid. The second portion of the via has a larger surface area than the first portion. The apparatus further includes means for sealingly connecting the body to the sheet.

The present invention provides significantly greater heat transfer than would normally be observed by use a similar bag without a thermal via, since the first portion of the via directly contacts the heat-generating component and transfers heat by conduction through the via and to the second portion which is immersed in the heat transfer liquid within the bag. As such, the transfer of heat into the liquid is not hindered by the thermal resistance of the bag in areas adjacent the component. Moreover, the second portion of the via presents a relatively large surface area in order to function as a heat-dissipating fin within the heat transfer liquid.

DETAILED DESCRIPTION OF THE PREFERRED EMBODIMENT

Figure 1:
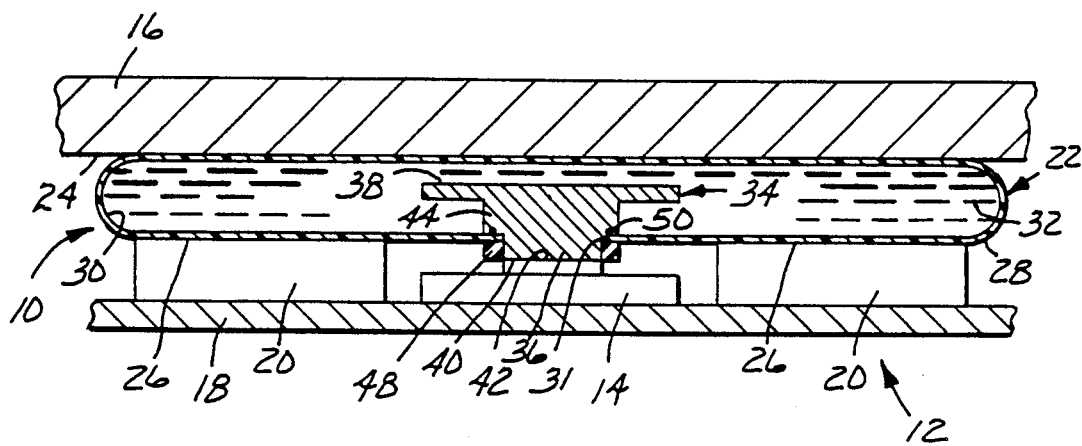
FIG. 1 is a fragmentary, side cross-sectional view showing heat transfer apparatus constructed in accordance with the present invention and placed between a heat-generating component and a heat-dissipating element.

Referring initially to FIG. 1, a heat transfer apparatus 10 is adapted for placement in an electrical device 12 between and in intimate contact with an outermost external surface 42 of a heat-generating component 14 and a facing external surface 24 of a heat-dissipating body 16. The component 14 is mounted on a circuit board 18 of the device 12 between two other components 20 which generate somewhat less heat than the component 14.

The apparatus 10 includes a flexible, sealed bag 22 which conforms to the space between the body 16 and the components 14, 20, such that one side of the bag 22 presses against the external surface 24 of the body 16 and an opposite side of the bag 22 presses against a facing external surface 26 of each component 20. The bag is made of a sheet of material 28 which is impermeable to air, and the bag 22 has an internal compartment 30 along with a circular hole 31 that provides an aperture between the compartment 30 and areas external of the bag 22.

The sheet of material 28 is made of a single or multilayer plastic film and may optionally be a thermoplastic film because the latter are readily available and are often heat sealable. Further properties, details of construction and examples of such material are set out in copending U.S. patent application Ser. No. 07/503,839, filed Apr. 3, 1990, the disclosure of which is hereby expressly incorporated by reference into the present disclosure.

A currently preferred material for the sheet 28 comprises a multi-layer film which is made of the following layers, beginning with the layer which constitutes the outer surface of the bag 22: (1) 3M No. 92 Kapton tape, available from the assignee of the present invention; and (2) American National Can Pantry Pack No. 50 film, available from American National Can Company of West Madison Street, Mount Vernon, Ohio, 43050. The 3M Kapton tape consists of 1.0 mil duPont Kapton film type HN and 1.8 mil 3M adhesive No. 41-3200-1568-2 (which is a blend of silicone, toluene and xylene). The Pantry Pack film is a multi-layer film consisting of 0.48 mil PET polyester (which is placed next to the adhesive of the 3M Kapton tape), a laminating adhesive, a 0.50 mil aluminum foil, a laminating adhesive and 3.0 mil modified polypropylene film. The latter polypropylene film thus represents the inner surface of the bag 22 which defines the compartment 30.

A quantity of heat transfer liquid 32 substantially fills the compartment 30 and comprises a fluorochemical liquid that is thermally conductive, chemically inert, essentially gas-free and thermally stable. The liquid 32 is electrically non-conductive to prevent short circuiting of electronic components should the bag 22 rupture for any reason. In addition, the inert character of the liquid 32 may prevent substantial damage to electronic devices or system housings if the bag 22 ruptures. The thermal stability of the liquid 32 enables the latter to maintain its physical and chemical properties through repetitive thermal cycles of the device 12 normally encountered during use. Particularly preferred liquids and other properties of such liquids are set out in the aforementioned copending application, U.S. Ser. No. 7/503,839.

Figure 2:
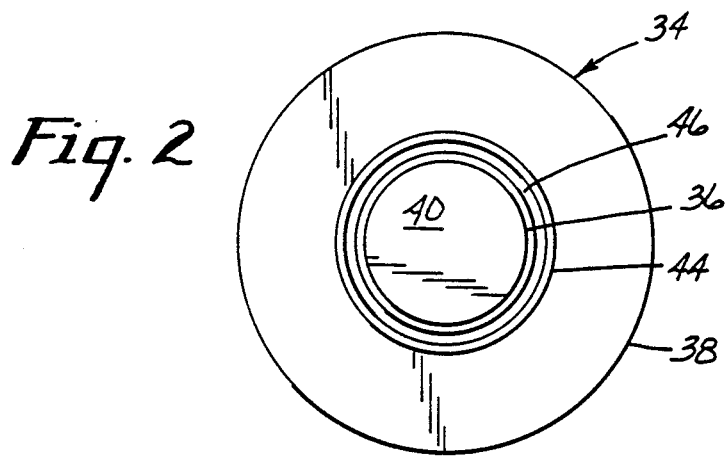
FIG. 2 is an enlarged bottom view of a thermal via of the apparatus shown in FIG. 1.

A thermal via 34 extends through the hole 31 in the sheet 28 and is made of a material having a high thermal conductivity, preferably aluminum, that may exceed the thermal conductivity of the sheet 28. The via 34 is illustrated in more detail in FIGS. 2 and 3, and includes a first portion 36 on one side thereof and a second portion 38 on an opposite side thereof remote from the first portion 36. The first portion 36 is essentially cylindrical and extends externally of the bag 22, and has an outer surface 40 for direct, intimate thermal contact with the outer, top surface 42 of the heat-generating component 14. Preferably, both of the surfaces 40, 42 are planar for assuring intimate face-to-face contact and good thermal coupling when the via 34 engages the component 14.

The second portion 38 of the via 34 extends internally in the compartment 30 for direct, intimate contact with the heat transfer liquid 32. The compartment 30 is substantially filled with the liquid 32 to insure that the second portion 38 is completely immersed in the liquid 32, and also to insure that there are no substantial air pockets or voids at the top of the compartment 30 (viewing FIG. 1) so that the liquid 32 is in direct contact with the portion of the sheet 28 that abuts the lower surface 24 of the heat dissipating body 16.

Figure 3:
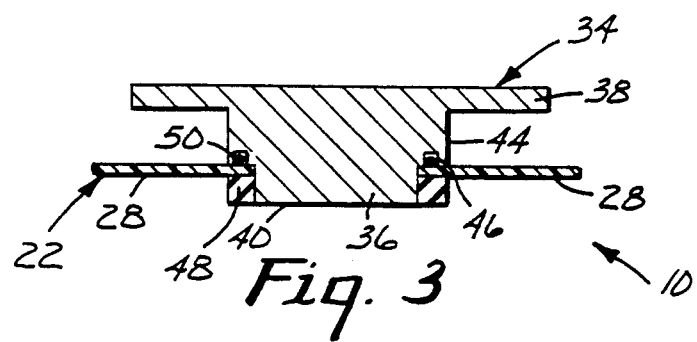
FIG. 3 is a side cross-sectional view of the via shown in FIG. 2 along with a lock ring and O-ring for sealingly connecting the via to a bag of the apparatus.

As shown in FIG. 3, the first portion 36 is separated from the second portion 38 by an intermediate portion 44 having an annular groove 46. The intermediate portion 44, like the second portion 38 and the first portion 36, is substantially cylindrical, and has a diameter intermediate the respective diameters of the portions 36, 38. The hole 31 in the sheet 28 is approximately the same diameter as the diameter of the first portion 36, so that the perimeter of the hole 31 lies on the shoulder presented by the intermediate portion 44 radially inwardly of the groove 46.

An annular lock ring 48, together with an O-ring 50 that is received in the groove 46, comprises a means for sealingly connecting the via 34 to the sheet 28 in an area adjacent the hole 31. The lock ring 48 has an inner diameter slightly smaller than the outer diameter of the first portion 36 in order to establish a self-sustaining, interference fit relationship when the lock ring 48 is pressed over the first portion 36. During such assembly, the lock ring 48 presses the sheet 28 against the O-ring 50 in order to connect the via 34 to the bag 22 in essentially leak-free relation.

The second portion 38 of the via 34 has a larger external surface area than the exposed external surface area of the first portion 36 so that the second portion 38 functions as a heat-radiating fin to quickly dissipate thermal energy conducted from the component 14 to the first portion 36. The intermediate portion 44, being of smaller diameter than the second portion 38, serves as a stand-off in order to space the second portion 38 away from the sheet 28 and enable the liquid 32 to contact the underside of the second portion 38 viewing FIGS. 1 and 3. In addition to the second portion 38, the cylindrical external surface of the intermediate portion 44 also conducts a certain portion of the thermal energy within the via 34 directly to the liquid 32.

During assembly of the apparatus 10 it is preferable to punch the hole 31 in the sheet 28 using conventional die punching processes before the sheet 28 is formed into the shape of the bag 22. However, as an alternative, the outer circular edge of the first portion 36 may be used to punch the hole 31 when the lock ring 48 is pressed onto the via 34.

The top surface of the bag 22 (viewing FIG. 1) is in direct, face-to-face contact with the surface 24 of the heat-dissipating body 16 when the lower, outer surface 40 of the via 34 is in direct planar contact with the upper surface 42 of the heat-generating component 14. Since the sheet 28 is flexible, the via 34 will self-shift due to internal pressures and/or weight of the appartus 10 until the surfaces 40, 42 are in flat, planar contact with each other. The flexible nature of the bag 22 enables the sheet 28 to simultaneously also flatwise contact the upper surfaces 26 of the components 20 even though the surfaces 26 may not be coplanar with each other, and even though the height of the first portion 36 may be different than the vertical dimension between the surface 42 and either of the surfaces 26. The apparatus 10 may also be made with multiple vias, each similar to via 34, so that a number of electrical components generating a relatively large amount of heat can each simultaneously contact a respective via even though only a single bag similar to bag 22 is provided.

EXAMPLE

In one set of experiments, apparatus similar to apparatus 10 was placed in testing equipment such that an external via surface similar to surface 40 was in a horizontal orientation and directly over a heated disk. An insulating ring surrounded the disk so that substantially all of the thermal energy entering the bag was conducted through the via. A layer of thermal grease was placed between the disk and the via. The upper surface of the bag was in contact with a horizontal cold plate, and a thermocouple wedged between the cold plate and the bag monitored a temperature which was essentially the average of the temperatures of the upper portion of the bag and the lower surface of the cold plate. A data acquisition system recorded the current of electricity supplied to the heated disk at constant voltage, the temperature of the disk and the temperature indicated by the thermocouple. The system was determined to be at equilibrium when the disk temperature and the temperature indicated by the thermocouple did not change more than one-half degree Centigrade in one minute. Results were then compared with tests conducted using a similar bag without the via. It was observed that the overall thermal resistance was 3.9° C./watt for the apparatus with the via, and 11.6 for the apparatus without the via. As such, the apparatus with the via represented an improvement in overall heat transfer performance by a factor of about 2.98. The heat flux at the highest power level tested using the apparatus with the via was in excess of 14.3 watts/cm$^2$. The apparatus with the via was most effective when the bag was in an essentially horizontal orientation, with the cold plate over the bag and the heat-generating component directly under the via.

I claim:

1. Heat transfer apparatus adapted for placement between a surface of a component to be cooled and a surface of a heat-dissipating body, said apparatus comprising:
   a flexible, sealed bag made of a sheet of material impermeable to air and having an internal compartment, said sheet having a hole;
   a quantity of heat transfer liquid substantially filling said compartment;
   a thermal via extending through said hole in said sheet and having a high thermal conductivity, said via having a first portion extending externally of said bag for thermal contact with a surface of a heat-generating component and a second portion extending internally in said compartment for contact with said heat transfer liquid said second portion having a larger surface area than said first portion; and
   means for sealingly connecting said via to said sheet.

2. The apparatus of claim 1, wherein said second portion has a cross-sectional area that is larger than said hole.

3. The apparatus of claim 2, wherein said via includes an intermediate portion between said first portion and said second portion, and wherein said first portion has a cross-sectional area approximately equal to the area of said hole, and wherein said second portion is spaced from said sheet for contact on opposite sides thereof with said liquid.

4. The apparatus of claim 1, wherein said first portion has a flat, outermost surface.

5. The apparatus of claim 1, wherein said means for sealingly connecting said via to said sheet comprises a lock ring surrounding said first portion.

6. The apparatus of claim 5, wherein said means for sealingly connecting said via to said sheet further comprises an O-ring located between said lock ring and said via.

7. The apparatus of claim 1, wherein said sheet includes a layer comprised of aluminum.

8. The apparatus of claim 1, wherein said first portion and said second portion each have a generally cylindrical configuration, and said second portion has a diameter larger than the diameter of said portion.

9. The apparatus of claim 8, wherein said first portion and said second portion are coaxial.

10. The apparatus of claim 1, wherein said via is made of a metallic material.

11. The apparatus of claim 1, wherein said liquid comprises a fluorochemical liquid.

* * * * *